United States Patent [19]

Kubota et al.

[11] 4,061,964

[45] Dec. 6, 1977

[54] ARMATURE OPERATION-RELEASE TESTING APPARATUS

[75] Inventors: Hitoshi Kubota, Yokohama; Takashi Kobayashi, Fujisawa, both of Japan

[73] Assignee: Hitachi, Ltd., Japan

[21] Appl. No.: 704,963

[22] Filed: July 13, 1976

[30] Foreign Application Priority Data

July 14, 1975 Japan .................................. 50-85401

[51] Int. Cl.² ............................................. G01R 31/02
[52] U.S. Cl. .................................................. 324/28 SE
[58] Field of Search .......................... 324/28 R, 28 SE

[56] References Cited

U.S. PATENT DOCUMENTS 3,345,522  10/1967  Reuther ........................... 324/28 SE

*Primary Examiner*—M. Tokar
*Attorney, Agent, or Firm*—Craig & Antonelli

[57] ABSTRACT

An armature operation-release testing apparatus for an electromagnetic relay of the type in which an armature is adapted to move toward and away from a core in a direction different from the direction of movement of a movable contact. The test for the operating characteristic of the electromagnetic relay is carried out by supplying an operating current to the electromagnetic coil of the relay to attract the armature to the core, positioning an externally controlled sensor to a test position slightly displaced toward the armature beyond the armature attracting surface of the core, and detecting electrical engagement between the sensor and the armature. The test for the releasing characteristic of the relay is then carried out by supplying a releasing current to the coil in lieu of the operating current, positioning the sensor at the test position again, and detecting electrical engagement between the sensor and the armature.

1 Claim, 5 Drawing Figures

ARMATURE OPERATION-RELEASE TESTING APPARATUS

BACKGROUND OF THE INVENTION

This invention relates to an armature operation-release testing apparatus for testing the armature operating and releasing characteristics of an electromagnetic relay having an armature.

Principal operating characteristics of electromagnetic relays employing an armature adapted to be moved toward and away from a core include the operating characteristic and the releasing characteristic. The operating characteristic refers to the capability of attracting the armature toward the core in response to the application of a predetermined operating current to the electromagnetic coil, while the releasing characteristic refers to the capability of releasing the armature from the position attracted to the core to restore it to the original position when the operating current applied to the electromagnetic coil is switched over to a predetermined releasing current.

Electromagnetic relays of general type employing an armature for the make-break of contacts, for example, wire spring relays are generally so constructed that the armature and the movable contact are urged in the same direction, and the armature is mechanically connected to the movable contact through a card to actuate the same. In such relays, therefore, it is merely necessary to check the make-break of the contacts for testing the armature operating and releasing characteristics of the relays.

There are however some electromagnetic relays of special types in which an armature is urged in a direction normal to the direction of movement of a movable contact and is not mechanically connected to the movable contact to actuate the same. In such special electromagnetic relays, visual check of the movement of the armature is generally resorted to in the test for the armature operating and releasing characteristics due to the fact that the make-break of the contacts is not directly caused by the armature. However, such visual check of the movement of the armature in the relay is defective in that the complete operating state of the armature cannot be exactly distinguished from the so-called quasi-operating state in which the armature is not fully attracted toward the core. Further, the test resorting to this visual check is extremely inefficient.

SUMMARY OF THE INVENTION

It is a primary object of the present invention to provide an armature operation-release testing apparatus of simple construction which is capable of automatically testing the armature operating and releasing characteristics of an electromagnetic relay irrespective of the make-break of contacts and which can accurately judge the eligibility of the armature performance and improve the efficiency of the test.

Other objects and advantages of the present invention will become apparent in consideration of the ensuing description and the accompanying drawing.

The present invention contemplates the provision of an armature operation-release testing apparatus for testing the armature operating and releasing characteristics of an electromagnetic relay comprising an armature, an electromagnetic coil and a core by supplying a predetermined operating current to the electromagnetic coil of the relay, advancing an externally controlled sensor, which is engageable with the armature to establish electrical connection, to a detecting position displaced slightly toward the armature beyond the armature attracting surface of the core disposed opposite to the armature for detecting electrical engagement between the armature and the sensor, retracting the armature from the position attracted to the core to a retracted or stand-by position spaced apart from the detecting position, interrupting the operating current supplied to the electromagnetic coil, supplying in turn a predetermined releasing current to the coil, and advancing the sensor to the detecting position again for detecting electrical engagement between the armature and the sensor.

DESCRIPTION OF THE PREFERRED EMBODIMENT

Figure 1:
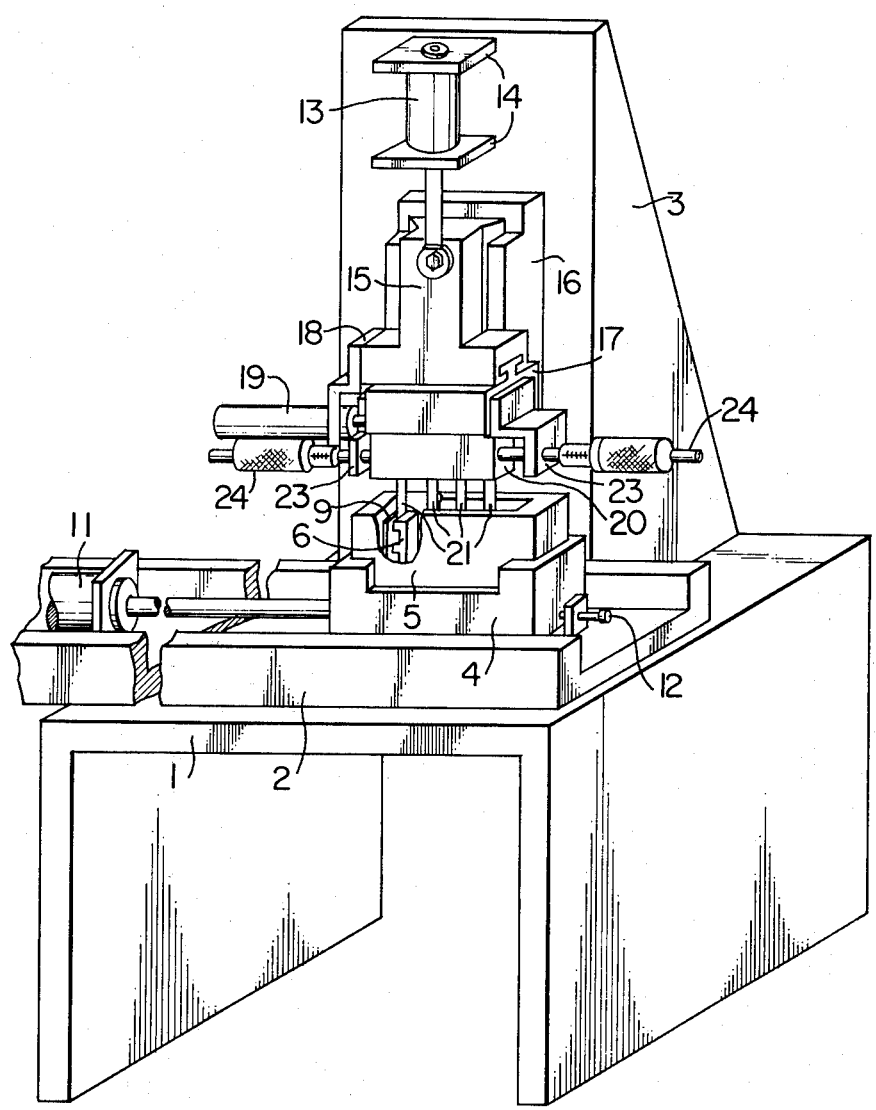
FIG. 1 is a perspective view of an embodiment of the armature operation-release testing apparatus according to the present invention.
Figure 2:
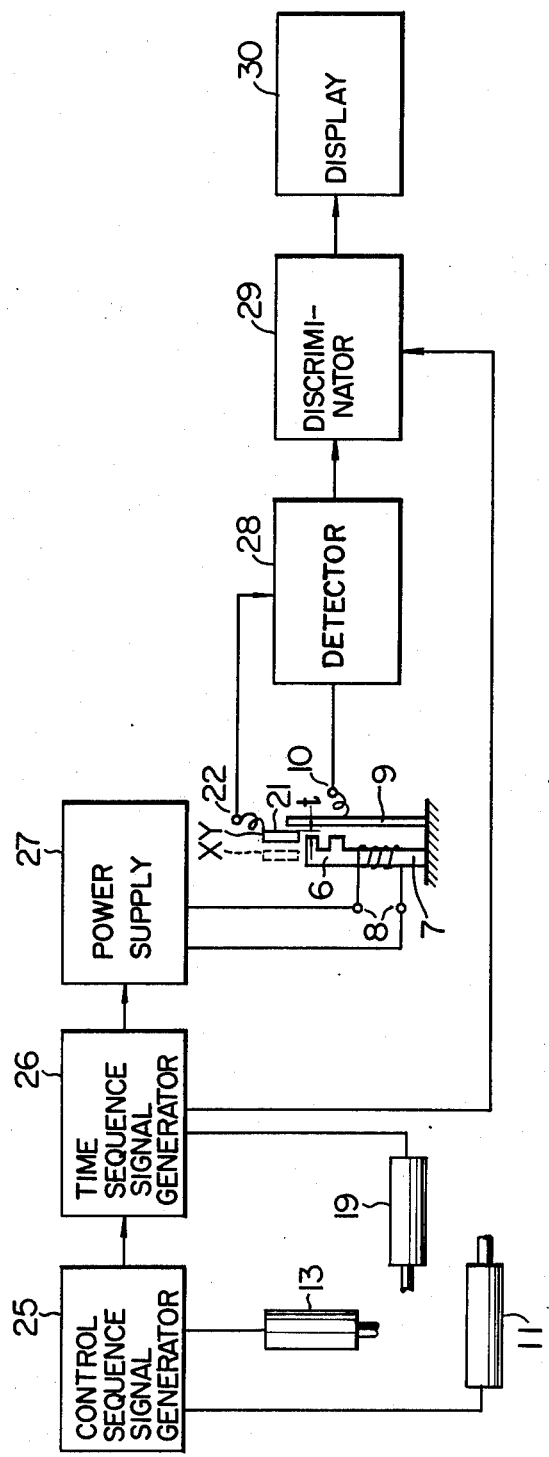
FIG. 2 is a block diagram of a signal processing and control system preferably used with the apparatus shown in FIG. 1.

Referring to FIGS. 1 and 2 and showing a preferred embodiment of the apparatus according to the present invention, a guide rail unit 2 and a stay 3 are secured to the upper surface of a table 1. A jig 4 is mounted on the guide rail unit 2 for horizontal sliding movement. This jig 4 supports an electromagnetic relay 5 comprising a plurality of armatures 9 which are urged in a direction different from the direction of movement of associated movable contacts. An electromagnetic coil 7 wound around each of a plurality of cores 6 of the electromagnetic relay 5 is electrically connected to a pair of input terminals 8, and each of the armatures 9 is electrically connected to another input terminal 10. A pneumatic cylinder 11 (hereinafter referred to merely as a cylinder) is fixedly mounted on the guide rail unit 2, and one end of the cylinder rod of the cylinder 11 is mechanically connected to the jig 4 so that the cylinder 11 can cause horizontal sliding movement of the jig 4 on the rail unit 2. A stopper 12 is adjustably mounted to the rail unit 2 so that the jig 4 connected to the cylinder rod of the cylinder 11 can be stopped at a predetermined test position.

A pair of vertically spaced holding plates 14 are secured to an upper part of the stay 3 to securely hold therebetween another pneumatic cylinder 13 (hereinafter referred to merely as a cylinder). A guide member 16 is secured to a vertically central part of the stay 3, and a ram 15 is supported on this guide member 16 for vertical sliding movement. The lower end of the cylinder rod of the cylinder 13 is mechanically connected to the ram 15 so that the cylinder 13 can cause vertical sliding movement of the ram 15 along the guide member 16. A slide block 17 is received in a guideway provided in the bottom of the ram 15 for horizontal sliding movement, and one end of the cylinder rod of another pneumatic cylinder 19 (hereinafter referred to merely as a cylinder) supported on the left-hand side of the ram 15 through a mounting plate 18 is mechanically connected to the slide block 17 so that the cylinder 19 can cause horizontal sliding movement of the slide block 17 along the guideway of the ram 15. A sensor block 20 carrying a plurality of spaced sensors 21 of conductive material is received in a guideway provided in the bottom of the slide block 17 for horizontal sliding movement. Each of these sensors 21 is electrically connected to another input terminal 22. The sensor block 20 is adjustably held between a pair of micrometer heads 24 mounted to the left-hand and right-hand sides of the slide block 17 through respective mounting plates 23, so that the moving distance of the sensors 21 carried by the slidable sensor block 10 can be accurately read.

A control sequence signal generator 25 generates an instruction signal for starting and controlling the operation of the cylinders 11 and 13, and detects the completion of the operation of the cylinders 11 and 13 when the cylinder rods of these cylinders are extended over the required strokes. A test time sequence signal generator 26 is electrically connected to the control sequence signal generator 25 so as to start and control the operation of the cylinder 19 under control sequence signal generator 15. Further, the test time sequence signal generator 26 controls the test timing by detecting the end of the stroke of the cylinder rod of the cylinder 19. A power supply 27 is electrically connected to the test time sequence signal generator 26 so as to selectively supply a predetermined operating current and a predetermined releasing current to the electromagnetic coil 7 through the input terminals 8 under control of the test time sequence signal generator 16. A detector 28 is electrically connected to the input terminals 10 and 22 to detect a voltage appearing across these input terminals 10 and 22 thereby detecting electrical engagement between the armature 9 and the sensor 21. A discriminator 29 is electrically connected to the test time sequence signal generator 26 and to the detector 28 for discriminating between eligibility and ineligibility of the armature performance on the basis of the result of detection applied from the detector 28. A display 30 is electrically connected to the discriminator 29 for displaying eligibility or ineligibility of the armature performance on the basis of the result of discrimination applied from the discriminator 29.

The test procedure with the apparatus having such a structure will now be described. The sensor block 20 is moved to and fixed at a predetermined position by manipulating the micrometer heads 24 for accurately positioning the sensors 21. The position of the stopper 12 is adjusted so that the jig 4 can be stopped at a predetermined position. The power supply 27 is suitably regulated so as to supply a predetermined operating current and a predetermined releasing current to the input terminals 8. The electromagnetic coils 7 of the electromagnetic relay 5 are connected to the input terminals 8, and the armatures 9 are connected to the input terminals 10. Then, the cylinder 11 is actuated under control of the control sequence signal generator 25, and the jig 4 supporting the electromagnetic relay 5 is shifted toward the right in FIG. 1 along the rail unit 2 until finally it is stopped by abutting the stopper 12. Since the position of the stopper 12 is adjusted previously, the jig 4 and the electromagnetic relay 5 carried by the jig 4 are maintained at the test position. The cylinder 13 is then actuated under control of the control sequence signal generator 25 to cause vertical downward movement of the ram 15. As a result, the sensor block 20 supported by the ram 15 through the slide block 17 is urged vertically downward to bring the sensors 21 to a position opposite to the armatures 9 of the electromagnetic relay 5.

Referring to FIG. 2 showing the relation among the associated ones of the sensors 21, armatures 9 and cores 6, the sensor 21 is brought to a predetermined stand-by position X (as shown by the dotted lines) at which it is opposed by the armature 9 and spaced apart from the position occupied by the armature 9 in response to the application of the operating current. The test time sequence signal generator 26 is then actuated under control of the control sequence signal generator 25 so as to apply the test starting instruction signal to the power supply 27 and discriminator 29. The power supply 27 supplies the predetermined operating current to the electromagnetic coil 7 of the electromagnetic relay 5. The armature 9 is attracted to the core 6 when the armature operating characteristic of electromagnetic relay 5 is equivalent to or better than the predetermined limit setting value. However, when the armature operating characteristic of the electromagnetic relay 5 is worse than the predetermined limit setting value, the armature 9 is merely advanced to a position intermediate between its released position and the core 6 (which state of the armature 9 is called a quasi-operating state hereinafter), or the armature 9 is not substantially urged and fails to be attracted to the core 6 (which state of the armature 9 is called a non-operating state hereinafter).

The cylinder 19 is then actuated under control of the test time sequence signal generator 26 so as to advance the slide block 17, hence the sensor 21 from the stand-by position X to a detecting position Y (as shown by the solid lines in FIG. 2) which is displaced toward the armature 9 and spaced apart by a distance $t$ from the attracting surface P of the core 6. When the armature 9 has already been attracted to the core 6 at this time, the armature 9 is engaged by the sensor 21, and the electrical engagement between the armature 9 and the sensor 21 is detected by the detector 28. However, in the case in which the armature 9 is placed in the quasi-operating state or non-operating state, the armature 9 is not fully attracted toward the core 6, and the sensor 21 does not engage the armature 9. In this latter case, therefore, the detector 28 detects that the electrical engagement between the armature 9 and the sensor 21 is not provided.

The cylinder rod of the cylinder 19 is then retracted so as to retract the slide block 17, hence the sensor 21 from the detecting position Y to the stand-by position X. The operating current having been supplied from the power supply 27 to the electromagnetic coil 7 of the electromagnetic relay 5 is then switched over to the releasing current under control of the test time sequence signal generator 26. When the armature releasing characteristic of the electromagnetic relay 5 is equivalent to or better than the predetermined limit setting value, the armature 9 having been attracted to the core 6 is released from the core 6 by its resiliency. However, when the armature releasing characteristic of the electromagnetic relay 5 is worse than the predetermined limit setting value, the armature 9 is not released and remains attracted to the core 6.

Figure 3:
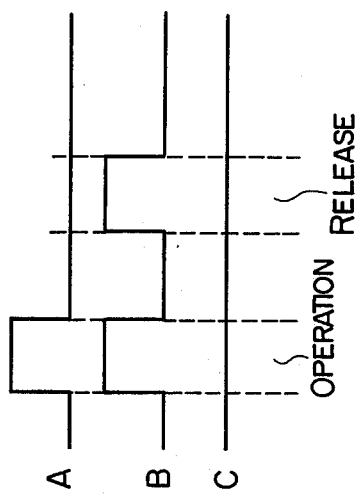
FIGS. 3A to 3C show output waveforms appearing from a detector in FIG. 2 when the armature functions properly, malfunctions during releasing, and malfunctions during operating, respectively.

The cylinder 19 is then actuated under control of the test time sequence signal generator 26 to advance the slide block 17, hence the sensor 21 from the stand-by position X to the detecting position Y, and after a predetermined period of time, to the stand-by position X again. When the armature 9 has already been released from the core 6 when the sensor 21 is advanced to the detecting position Y, the sensor 21 does not engage the armature 9, and the detector 28 detects that the armature 9 is released from the core 6. However, when the armature 9 has not been released from the core 6 in the above instance, the sensor 21 engages the armature 9, and the detector 28 detects that the armature 9 fails to be released from the core 6. Signal waveforms as shown in FIGS. 3A to 3C are applied from the detector 28 to the discriminator 29 depending on the performance of the armature 9 in the electromagnetic relay 5. The discriminator 29 starts and completes the discriminating operation under control of the test time sequence signal generator 26. For example, the detector 28 applies a signal waveform as shown in FIG. 3A when the electrical engagement between the armature 9 and the sensor 21 is detected during the test for the operating characteristic of the electromagnetic relay 5, and in response to the application of such signal waveform, the discriminator 29 determines that the electromagnetic relay 5 "stands" the test for the operating characteristic. The detector 28 applies a signal waveform as shown in FIG. 3B when the electrical engagement between the armature 9 and the sensor 21 is detected during both the test for the operating characteristic and the test for the releasing characteristic of the electromagnetic relay 5, and in response to the application of such signal waveform, the discriminator 29 determines that the electomagnetic relay 5 "fails to stand" the test for the releasing characteristic. The detector 28 applies no signal as shown in FIG. 3C when the electrical engagement between the armature 9 and the sensor 21 is not detected during the test for the operating characteristic of the electromagnetic relay 5, and in such a case, the discriminator 29 determines that the electromagnetic relay 5 "fails to stand" the test for the operating characteristic. The result of determination is applied from the discriminator 29 to the display 30, and depending on the result of determination applied from the discriminator 29, the display 30 displays eligibility or ineligibility of the electromagnetic relay 5 by, for example, display lamps.

The sensor 21 is retracted to the stand-by position X again upon completion of the test for the releasing characteristic of the electromagnetic relay 5. The cylinder 13 is actuated to cause vertical upward movement of the ram 15 under control of the control sequence signal generator 25, thereby causing vertical upward movement of the sensor 21 to pull up the same from the stand-by position X relative to the armature 9. The cylinder 11 is then actuated under control of the control sequence signal generator 25 to shift the jig 4 toward the left-hand end of the rail unit 2 and to stop the same at this end. The electromagnetic relay 5 and subjected to the test is then removed from the jig 4 placed in one of predetermined stations depending on the test result displayed on the display 30. By the repetition of the procedure above described, electromagnetic relays 5 can be successively tested for their armature operating and releasing characteristics.

The aforementioned embodiment is constructed to hold the sensor block 20 between the pair of micrometer heads 24 for accurately reading the moving distance of the sensors 21. It is apparent however that the same effect can be obtained even when one of the micrometer heads 24 is replaced by a suitable resilient holding member. Further, the above effect can also be exhibited even when graduations similar to those of slide calipers are provided on both the slide block 17 and the sensor block 20, and one of the micrometer heads 24 is replaced by a suitable resilient holding member, while the other is replaced by an adjustable holding means such as a screw. The sensor block 20 should be fixed to the slide block 17 when the apparatus is exclusively used for the testing of electromagnetic relays of one and the same kind.

We claim:

1. An armature operating-release testing apparatus for testing the armature operating and releasing characteristics of an electromagnetic relay comprising an armature, a core and an electromagnetic coil, said apparatus comprising:
    a. means for causing reciprocating movement of an externally controlled sensor between a stand-by position, at which said sensor is initially positioned opposite to and free from any electrical engagement with said armature of said electromagnetic relay disposed at a test position, and a detecting position at which said sensor is slightly displaced toward said armature beyond the armature attracting surface of said core;
    b. power supply means adapted to be switched over for selectively supplying a predetermined operating current and a predetermined releasing current to said electromagnetic coil of said electromagnetic relay thereby causing movement of said armature toward and away from said core;
    c. detecting means connected to said armature and said sensor for detecting electrical engagement between said armature and said sensor; and
    d. test time sequence signal generating means for controlling the operating timing of said detecting means, said power supply means and said sensor moving means so as to test said electromagnetic relay for the operating characteristic by supplying the operating current to said electromagnetic coil while said sensor is positioned at said stand-by position, advancing said sensor to said detecting position in a predetermined period of time, and detecting the output of said detecting means, and so as to test said electromagnetic relay for the releasing characteristic by retracting said sensor to said stand-by position from said detecting position, switching over said power supply means to supply the releasing current to said electromagnetic coil in lieu of the operating current, advancing said sensor to said detecting position again in a predetermined period of time, and detecting the output of said detecting means.

* * * * *